(12) United States Patent
Rascuna et al.

(10) Patent No.: US 11,715,769 B2
(45) Date of Patent: Aug. 1, 2023

(54) SILICON CARBIDE DIODE WITH REDUCED VOLTAGE DROP, AND MANUFACTURING METHOD THEREOF

(71) Applicant: STMicroelectronics S.r.l., Agrate Brianza (IT)

(72) Inventors: Simone Rascuna, Catania (IT); Claudio Chibbaro, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 182 days.

(21) Appl. No.: 17/375,426

(22) Filed: Jul. 14, 2021

(65) Prior Publication Data

US 2022/0028979 A1  Jan. 27, 2022

(30) Foreign Application Priority Data

Jul. 27, 2020 (IT) .......................... 102020000018130

(51) Int. Cl.
*H01L 29/16* (2006.01)
*H01L 29/66* (2006.01)
*H01L 29/872* (2006.01)

(52) U.S. Cl.
CPC .... *H01L 29/1608* (2013.01); *H01L 29/66143* (2013.01); *H01L 29/872* (2013.01)

(58) Field of Classification Search
CPC ........... H01L 29/1608; H01L 29/66143; H01L 29/872
USPC ....................................................... 257/471
See application file for complete search history.

(56) References Cited

U.S. PATENT DOCUMENTS

| | | | |
|---|---|---|---|
| 9,653,538 B2 | 5/2017 | Boeuf et al. | |
| 10,483,389 B2 * | 11/2019 | Yen | H01L 29/0619 |
| 2002/0125541 A1 | 9/2002 | Korec et al. | |
| 2009/0176341 A1 * | 7/2009 | Saggio | H01L 29/66712 |
| | | | 257/E21.418 |

(Continued)

FOREIGN PATENT DOCUMENTS

EP  3 067 935 A1  9/2016

OTHER PUBLICATIONS

Rupp et al., "A new SiC diode with significantly reduced threshold voltage," *Proceedings of the 29$^{th}$ International Symposium on Power Semiconductor Devices & ICs*, Sapporo, Japan, May 28-Jun. 1, 2017, pp. 355-358.

(Continued)

*Primary Examiner* — Monica D Harrison
(74) *Attorney, Agent, or Firm* — Seed Intellectual Property Law Group LLP

(57) ABSTRACT

An electronic device includes a solid body of SiC having a surface and having a first conductivity type. A first implanted region and a second implanted region have a second conductivity type and extend into the solid body in a direction starting from the surface and delimit between them a surface portion of the solid body. A Schottky contact is on the surface and in direct contact with the surface portion. Ohmic contacts are on the surface and in direct contact with the first and second implanted regions. The solid body includes an epitaxial layer including the surface portion and a bulk portion. The surface portion houses a plurality of doped sub-regions which extend in succession one after another in the direction, are of the first conductivity type, and have a respective conductivity level higher than that of the bulk portion.

20 Claims, 3 Drawing Sheets

(56) References Cited

U.S. PATENT DOCUMENTS

2015/0372093 A1  12/2015  Saggio et al.

OTHER PUBLICATIONS

Shannon, "Reducing the effective height of a Schottky barrier using low-energy ion implantation," *Applied Physics Letters* 24(8):369-371, Apr. 15, 1974.

* cited by examiner

SILICON CARBIDE DIODE WITH REDUCED VOLTAGE DROP, AND MANUFACTURING METHOD THEREOF

BACKGROUND

Technical Field

The present disclosure relates to an electronic device of silicon carbide (SiC) and to a manufacturing method thereof.

Description of the Related Art

On the market, switching devices have recently been proposed known as JBS (Junction Barrier Schottky) diodes or MPS (Merged PiN Schottky) diodes. These devices are generally of a SiC substrate and comprise implanted areas having a conductivity opposite to that of the substrate (e.g., of a P type for a substrate of an N type). In these devices, two distinct types of contacts are present: an ohmic one in the implanted areas, and a Schottky one in the areas comprised between the implanted areas.

The above characteristics render JBS diodes particularly suited to working in high-voltage power devices.

FIG. 1 shows, in lateral sectional view in a (triaxial) Cartesian reference system of axes X, Y, Z, an MPS device 1 of a known type.

The MPS device 1 includes: a substrate 3, of SiC of an N type, having a first dopant concentration, provided with a surface 3a opposite to a surface 3b, and having a thickness equal to approximately 350 µm; a drift layer (grown epitaxially) 2, of SiC of an N type, having a second dopant concentration lower than the first dopant concentration, which extends over the surface 3a of the substrate 3 and has a thickness comprised between 5 and 15 µm; an ohmic-contact region 6 (for example, of nickel silicide), which extends over the surface 3b of the substrate 3; a cathode metallization 16, which extends over the ohmic-contact region 6; an anode metallization 8, which extends over a top surface 2a of the drift layer 2; multiple junction-barrier (JB) elements 9 in the drift layer 2, which face the top surface 2a of the drift layer 2 and each include a respective implanted region 9' of a P type and an ohmic contact 9'' of metal material; and an edge-termination region, or protection ring, 10 (optional), in particular an implanted region of a P type, which completely surrounds the junction barrier (JB) elements 9.

Schottky diodes 12 are formed at the interface between the drift layer 2 and the anode metallization 8. In particular, Schottky junctions (i.e., semiconductor-metal junctions) are formed by portions of the drift layer 2 in direct electrical contact with respective portions of the anode metallization 8.

The region of the MPS device 1 that includes the JB elements 9 and the Schottky diodes 12 (i.e., the region contained within the protection ring 10) is an active area 4 of the MPS device 1.

At the basis of the design of JBS or MPS devices there is creation of a potential barrier designed to protect the metal/SiC Schottky junctions from high electrical fields generated in the SiC substrate. For this purpose, integrated in the drift layer 2 are the P implants 9', which laterally delimit surface portions of an N type, located close to one another, of the SiC drift layer 2. With deposition of the metallization 8 on the top surface of the drift layer 2, Schottky junctions are formed in parallel with PN junctions.

In a forward-biased JBS device, the current flows in the non-depleted Schottky regions comprised between the P implants 9', preserving the unipolar operating mode. In reverse biasing, conduction between the Schottky regions is suppressed by the pinch-off effect of the adjacent PN junctions. The reverse-biasing characteristic of the JBS device substantially corresponds to that of a PN junction. It is evident that the distance d (in the direction X of FIG. 1) between the P implants 9' should be chosen in an appropriate way to optimize the trade-off between the potential drop in the ON state (which increases with the reduction of said distance d) and the current losses (which decrease with the reduction of said distance d).

It is of fundamental importance to minimize the losses in conduction in discrete power devices in order to reduce the energy consumption of the circuits in which said devices are used. For this reason, the possibility of controlling the SBH (Schottky-Barrier Height) value is particularly important for controlling the potential drop of Schottky diodes. In particular, the reduction of the SBH value produces a significant reduction of the potential drop. However, the reduction of the SBH value presents the disadvantage of causing a substantial increase in the leakage current in reverse biasing. The distance between the P+ implants 9' should consequently be carefully designed.

A prior-art solution is provided by US2015/0372093, where a switching device is described, such as a JBS (Junction Schottky Barrier) diode, which has a solid body of silicon carbide of an N type, housing implanted regions of a P type (similar to the regions 9' of FIG. 1). The P implanted regions extend in the solid body starting from a surface thereof and delimit, between them, N+ doped surface portions, i.e., ones having a doping density higher than that of the bulk of the solid body. By modulating the surface concentration of the solid body through the aforementioned N+ implantation, it is possible to increase the surface electrical field and appropriately reduce the Schottky barrier. This solution consequently enables modification of the surface electrical field, improving the triggering characteristics of the device. However, the present applicant has found that the portions of solid body that extend between the P implanted regions, underneath the surface portion with the N+ implant, show a high ON resistance and offset the advantage deriving from the N+ surface implant.

BRIEF SUMMARY

In various embodiments, the present disclosure provides a SiC electronic device and a manufacturing method thereof that will overcome the drawbacks of the prior art, in particular one having a low voltage drop and a high efficiency.

According to the present disclosure an electronic device and a manufacturing method thereof are provided.

In at least one embodiment, an electronic device is provided that includes a solid body of silicon carbide having a surface and having a first conductivity type. First and second implanted regions have a second conductivity type and extend into the solid body in a direction starting from the surface and delimit between them a surface portion of the solid body. Schottky-contact metal portions are on the surface and in direct contact with the surface portion. Ohmic-contact metal portions are on the surface and in direct contact with the first and second implanted regions. The solid body includes an epitaxial layer including the surface portion and a bulk portion, and the surface portion extends over the bulk portion. The surface portion includes a plurality of doped sub-regions, which extend in succession one after another in the direction, each having the first conductivity type and a respective conductivity level higher than that of the bulk portion. The conductivity level of at least one of the doped sub-regions is different from the conductivity level of at least one other of the doped sub-regions.

In at least one embodiment, a method for manufacturing an electronic device is provided that includes: providing a solid body of silicon carbide having a surface and having a first conductivity type; forming in the solid body, by implantation of doping agents having a second conductivity type, a first implanted region and a second implanted region, which each extend in a direction starting from the surface and delimit between them a surface portion of the solid body, the solid body including an epitaxial layer including the surface portion and a bulk portion, the surface portion extending over the bulk portion; forming Schottky-contact metal portions on the surface and in direct contact with the surface portion; forming ohmic-contact metal portions on the surface and in direct contact with the first and second implanted regions; and forming in the surface portion, by respective implantations of doping agents having the first conductivity type, a plurality of doped sub-regions which extend in succession one after another in the direction, each having a respective conductivity level higher than that of the bulk portion, the conductivity level of at least one of the doped sub-regions being different from the conductivity level of at least one other of the doped sub-regions.

BRIEF DESCRIPTION OF THE SEVERAL VIEWS OF THE DRAWINGS

For a better understanding of the present disclosure, preferred embodiments thereof are now described purely by way of non-limiting example, with reference to the attached drawings, wherein.

DETAILED DESCRIPTION

Figure 2:
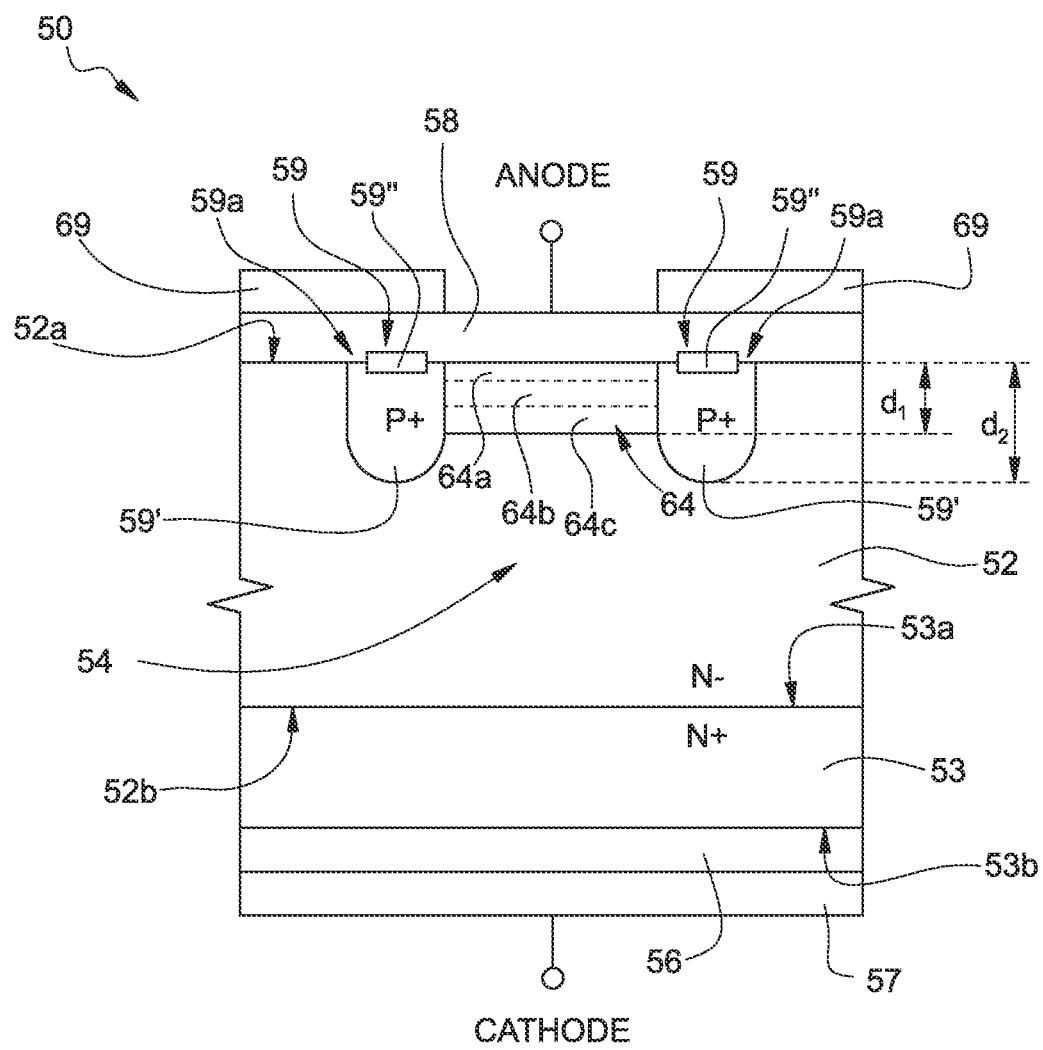
FIG. 2 is a cross-sectional view of the principle physical structure of a JBS semiconductor device, according to the present disclosure.

FIG. 2 shows, in lateral sectional view in a (triaxial) Cartesian reference system of axes X, Y, Z, a base cell of a JBS device (or diode) 50, according to an embodiment of the present disclosure.

The JBS device 50 includes: a substrate 53, of SiC of an N type, having a first dopant concentration, provided with a surface 53a opposite to a surface 53b, and having a thickness comprised between 50 μm and 350 μm, more in particular between 160 μm and 200 μm, for example equal to 180 μm; a drift layer (grown epitaxially) 52, of SiC of an N type, having a second dopant concentration lower than the first dopant concentration, which extends over the surface 53a of the substrate 53 and has a thickness comprised, for example, between 5 and 15 μm; an ohmic-contact region, or layer, 56 (for example, of nickel silicide), which extends over the surface 53b of the substrate 53; a cathode metallization 57, for example of Ti/NiV/Ag or Ti/NiV/Au, which extends over the ohmic-contact region 56; an anode metallization 58, for example of Ti/AlSiCu or Ni/AlSiCu, which extends over a top surface 52a of the drift layer 52; a passivation layer 69 on the anode metallization 58, for protection of the latter; multiple junction-barrier (JB) elements 59 in the drift layer 52, which face the top surface 52a of the drift layer 52 and each include a respective implanted region 59' of a P type and an ohmic contact 59".

Figure 1:
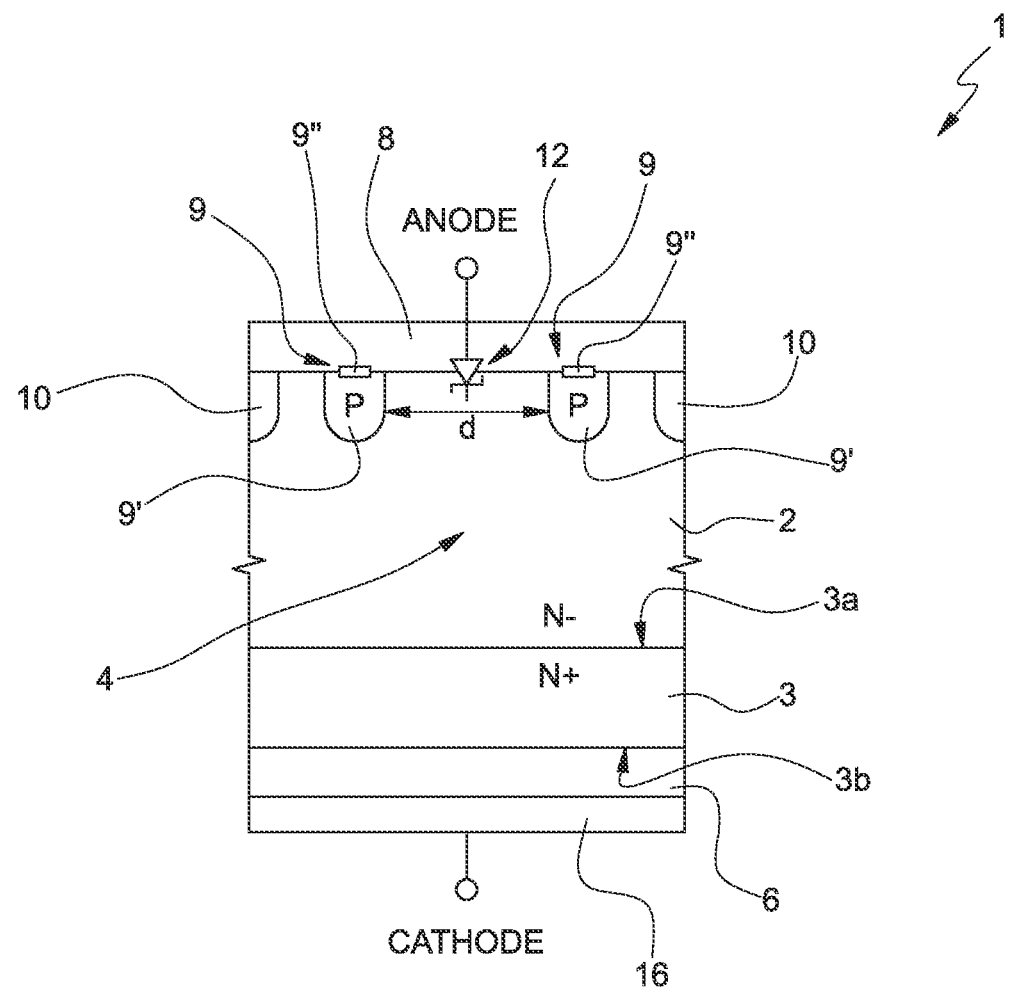
FIG. 1 is a cross-sectional view of the principle physical structure of a JBS semiconductor device of a known type.
Figure 1:
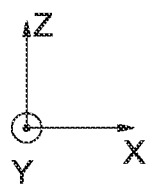

An edge-termination region, or protection ring (in particular, an implanted region of a P type, similar to the region 10 of FIG. 1) is optionally present and is not illustrated in FIG. 2.

One or more Schottky diodes 62 are formed at the interface between the drift layer 52 and the anode metallization 58, alongside the implanted regions 59'. In particular, (semiconductor-metal) Schottky junctions are formed by portions of the drift layer 52 in direct electrical contact with respective portions of the anode metallization 58.

The region of the JBS device 50 that includes the JB elements 59 and the Schottky diodes 62 (i.e., the region contained within the protection ring 60) is an active area 54 of the JBS device 50.

According to one aspect of the present disclosure, the top portion of the drift layer 52 is enriched, with respect to the rest of the drift layer 52, by a doped region 64 of an N+ type. For instance, in the case of the drift layer having a doping level of the order of $10^{16}$ at/cm$^3$, the doped region 64 may have a doping level higher than $1.5 \cdot 10^{16}$ at/cm$^3$. The depth of the doped region 64 is equal to or less than that of the implanted regions 59'; for example, the maximum depth $d_1$ of the implanted regions 59', measured along the axis Z starting from the surface 52a, is comprised between 0.4 μm and 1 μm, and the maximum depth $d_2$ of the doped region 64, measured along the axis Z starting from the surface 52a, is comprised between 0.4 μm and 1 μm.

The depth of the doped region 64 is equal to or less than that of the implanted regions 59'. In fact, the purpose of the implant that forms the region 64 is to reduce the resistance linked to pinch-off of the current path of the charge carriers in the area comprised between the implanted regions 59'. The present applicant notes that extending said N+ implant underneath the implanted regions 59', albeit possible, would not lead to an important advantage in so far as the path of the charge carriers in this area extends over the entire dimension of the layer 52. Moreover, a further N+ implant underneath the implanted regions 59' could reduce breakdown of the device by altering the PN junction.

The doped region 64 comprises, according to one aspect of the present disclosure, three doped sub-regions 64a, 64b, 64c, having respective doping levels. In detail:

the sub-region 64a has a doping level comprised between $1 \cdot 10^{16}$ at/cm$^3$ and $1 \cdot 10^{17}$ at/cm$^3$, in particular equal to approximately $5 \cdot 10^{16}$ at/cm$^3$;

the sub-region 64b has a doping level comprised between $1 \cdot 10^{17}$ at/cm$^3$ and $1 \cdot 10^{20}$ at/cm$^3$, in particular equal to approximately $5 \cdot 10^{18}$ at/cm$^3$; and the sub-region 64c has a doping level comprised between $1 \cdot 10^{16}$ at/cm$^3$ and $1 \cdot 10^{17}$ at/cm$^3$, in particular equal to approximately $1 \cdot 10^{16}$ at/cm$^3$.

The value of doping level of the region 64a is important because this region 64a is the one that, in a preponderant way, determines lowering of the barrier height (energy gap) of the Schottky contact, thanks to the increase of the surface electrical field. The doping level of the region 64a is consequently higher than the doping level of the epitaxial layer. The region 64c, instead, represents the "tail" of the implant and has a value that, in the limit, coincides with the doping level of the epitaxial layer.

Figure 3A:
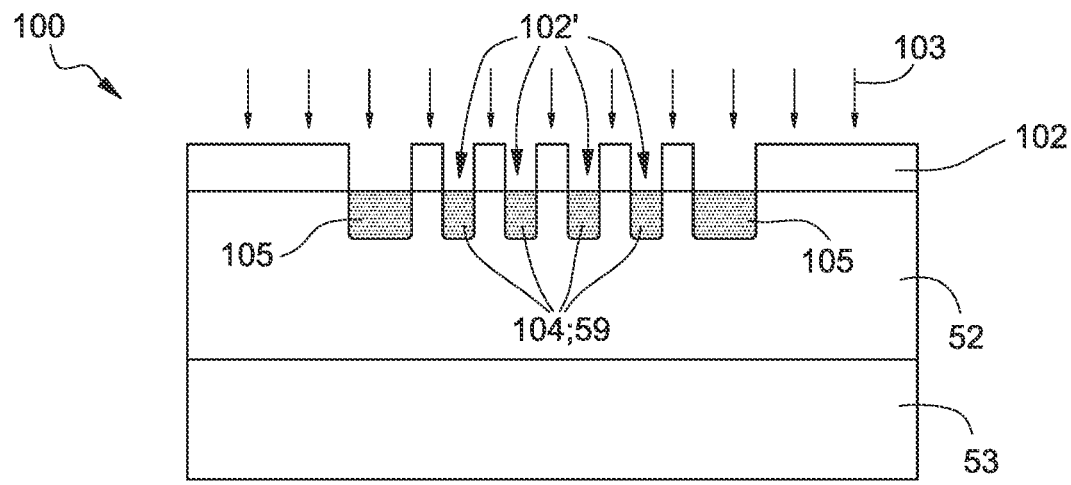
FIGS. 3A to 3C are cross-sectional views through a die of semiconductor material in successive steps of manufacture of the JBS device of FIG. 2.
Figure 3B:
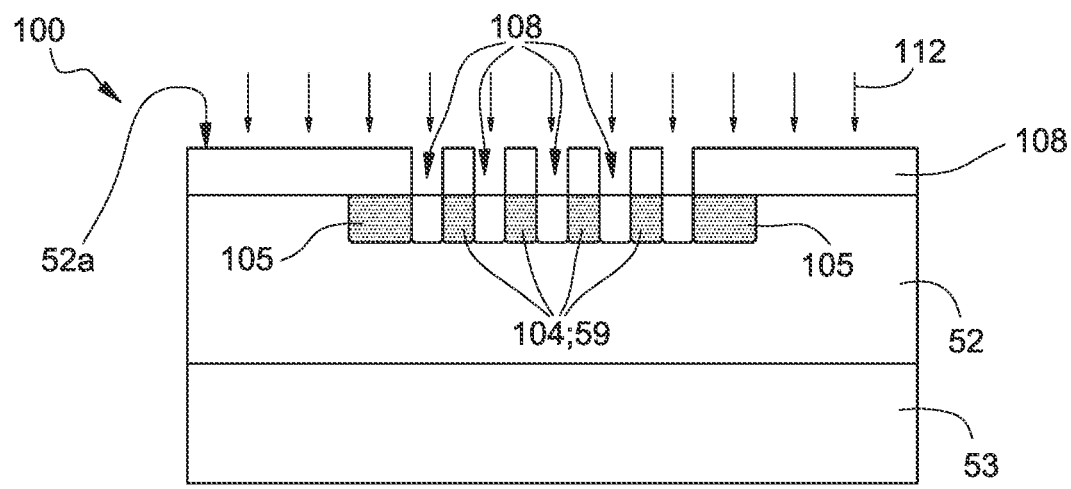
Figure 3C:
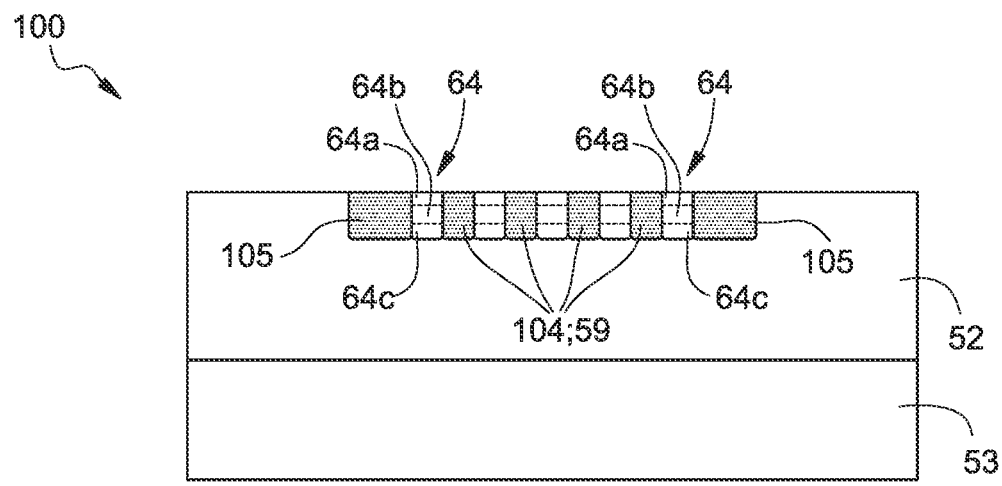

The JBS device 50 of FIG. 2 may be in the way described hereinafter with reference to FIGS. 3A-3C. FIGS. 3A-3C illustrate a portion of a wafer 100 including a plurality of base cells of the type illustrated in FIG. 2.

Initially (FIG. 3A), after forming the drift layer 52 on the substrate 53, for example by epitaxial growth in a per se known manner, a hard mask 102, having windows 102', is provided on the top surface 52a of the drift layer 52. Using the windows 102', there are carried out one or more implantations of a P type, represented schematically by arrows 103, for example of aluminium atoms at a dose of between $1.0 \cdot 10^{14}$ at/cm² and $1.0 \cdot 10^{15}$ at/cm² with energies of between 30 and 300 keV. Implanted regions of a P type 104 are thus formed. As described in what follows, after activation of the dopants P thus implanted, the implanted regions of a P type 104 will form the regions 59' of FIG. 2. Typically, in this step, a plurality of implantations is carried out at different energies and different doses, for positioning the dopants at the desired depth and with the desired concentrations (in particular, to obtain regions evenly doped in all directions). This is due to the fact that, unlike in silicon, in silicon carbide the dopant species do not diffuse following upon thermal annealing. It is therefore important to position the dopants as defined in the design stage, differentiating the different implantations according to energy and dose.

A guard ring 105 may be optionally formed, simultaneously with formation of the implanted regions of a P type 104. After removal of the hard mask 102 (FIG. 3B), a further hard mask 108 is formed on the top surface 52a of the drift layer 52. The hard mask 108 is provided with windows 108', which expose regions of the drift layer 52 comprised between the implanted regions of a P type 104. A step of masked implantation is then carried out to modify the conductivity of the surface region exposed through the windows 108'. For this purpose, doping agents of an N type (e.g., phosphorus) are implanted in the drift layer 52 on its top surface 52a (as represented schematically by the arrows 112), to form one or more implanted regions 114 comprised between respective implanted regions 104. In particular, the implanted regions 114 extend between implanted regions 104 and are adjacent to the implanted regions 104.

The implantation step of FIG. 3B comprises, in particular, one or more successive implantations, in particular two implantations, performed at different energies so as to localize the implanted dopant species at respective depths in the drift layer 52 in order to form the sub-regions 64a-64c described previously.

In one embodiment, a single implantation is carried out, with which it is possible to obtain a lowering of the Schottky barrier raising the surface electrical field, and a reduction of the resistance in the pinch-off area between the regions 59', concentrating therein the majority of the charge (in this case, the dose and the energy of the implantation are appropriately chosen in such a way that the residual dose of the implant at the surface is equal to the dose that is normally used for lowering the barrier, i.e., low dose and low energy). The implantation has, by way of example, a dose ranging between $1.0 \cdot 10^{13}$ and $1.0 \cdot 10^{15}$ (e.g., $1.0 \cdot 10^{14}$) at/cm², with energies of between 150 keV and 250 keV (e.g., 200 keV).

As further embodiment of the present disclosure, two distinct implantations are carried out: one at a low energy and low dose dedicated to lowering the Schottky barrier; and one at a higher energy and higher concentration to localize an additional charge in the pinch-off area between the regions 59'. The regions 64a and 64b are thus formed; the region 64c is formed as direct consequence of these two implantations, in particular as "tail" of the second implant at a high dose and high energy. By way of example, the first implantation has a dose of between $1.0 \cdot 10^{11}$ and $1.0 \cdot 10^{13}$ (e.g., $1.0 \cdot 10^{12}$), with an energy level of between 10 keV and 20 keV (e.g., 15 keV), and the second implantation has a dose of between $1.0 \cdot 10^{13}$ and $1.0 \cdot 10^{15}$ (e.g., $1.0 \cdot 10^{14}$) and an energy of between 150 keV and 250 keV (e.g., 200 keV).

Then (FIG. 3C), the hard mask 108 is removed, and a thermal process of activation of the dopant species implanted in the step of FIG. 3B is carried out, completing formation of the sub-regions 64a-64c described with reference to FIG. 2. The thermal process is carried out at a temperature equal to or higher than 1600° C. (in particular at 1600° C.-1800° C. for 10-60 minutes) and leads to formation of the implanted region 64 of FIG. 2.

Manufacture of the JBS device 50 is then completed with steps, which are in themselves known, do not form the subject of the present disclosure, and are therefore not illustrated in the figures, of formation of the anode metallization 58 and the cathode metallization 57, to obtain the JBS device 50 of FIG. 2.

The JBS device 50 described presents numerous advantages.

In particular, the voltage drop of the diode Schottky is reduced by reducing the SBH value and the resistance between the P+ implanted regions, as is evident from what has been described previously.

Finally, it is clear that modifications and variations may be made to what has been described and illustrated herein, without thereby departing from the scope of the present disclosure.

For instance, the material of the substrate 53 and/or of the epitaxial layer 52 may be one of the following: 4H—SiC, 6H—SiC, 3C—SiC, 15R—SiC.

In addition, the implanted region 64 may comprise only two sub-regions 64a and 64b, or else a number of implanted sub-regions greater than three.

An electronic device (50) may be summarized as including a solid body (52, 53) of silicon carbide having a surface (52a) and presenting a first conductivity type (N); a first implanted region (59') and a second implanted region (59'), which have a second conductivity type (P) and extend into the solid body (52, 53) in a direction (Z) starting from the surface (52a) and delimit between them a surface portion (64) of said solid body; Schottky-contact metal portions on the surface and in direct contact with the surface portion (64); and ohmic-contact metal portions on the surface and in direct contact with the first and second implanted regions (59'), wherein the solid body (52, 53) comprises an epitaxial layer (52) including said surface portion (64) and a bulk portion, the surface portion extending over the bulk portion, wherein the surface portion (64) houses alternatively: a doped sub-region (64a-64c) having the first conductivity type (N) and a conductivity level higher than that of the bulk portion; and a plurality of doped sub-regions (64a-64c), which extend in succession one after another in said direction (Z), each having the first conductivity type (N) and a respective conductivity level higher than that of the bulk portion.

The doped sub-regions (64a-64c) may be layered, thus forming a stack of doped layers that follow one another in said direction (Z).

The plurality of doped sub-regions (64a-64c) may include: a first sub-region (64a), which extends into the epitaxial layer (52) starting from the surface (52a); a second sub-region (64b), which extends in the epitaxial layer (52) adjacent, along said direction (Z), to the first sub-region (64a); and a third sub-region (64c), which extends in the epitaxial layer (52) adjacent, along said direction (Z), to the second sub-region (64b).

The doped sub-regions (64a-64c) may have a respective conductivity level such that the second sub-region (64b) has a conductivity higher than the first sub-region (64a) and the third sub-region (64c).

The first sub-region (64a) may have a doping level comprised between $1\cdot10^{16}$ at/cm$^3$ and $1\cdot10^{17}$ at/cm$^3$; the second sub-region (64b) may have a doping level comprised between $1\cdot10^{17}$ at/cm$^3$ and $1\cdot10^{20}$ at/cm$^3$; and the third sub-region (64c) may have a conductivity level comprised between $1\cdot10^{16}$ at/cm$^3$ and $1\cdot10^{17}$ at/cm$^3$.

The sum of the thicknesses of the first, second, and third sub-regions (64a-64c) may be equal to or less than the thickness, in said direction (Z), of each one of the first and second implanted regions (59').

The material of the solid body may be one of the following: 4H—SiC, 6H—SiC, 3C—SiC, 15R—SiC.

The device may form a JBS (Junction Barrier Schottky) diode; said epitaxial layer (52) being a drift layer of said JBS diode.

A method for manufacturing an electronic device (50) may be summarized as including: providing a solid body (52, 53) of silicon carbide having a surface (52a) and presenting a first conductivity type (N); forming in the solid body (52, 53), by implantation of doping agents having a second conductivity type (P), a first implanted region (59') and a second implanted region (59'), which each extend in a direction (Z) starting from the surface (52a) and delimit between them a surface portion (64) of said solid body; forming Schottky-contact metal portions on the surface (52a) and in direct contact with the surface portion (64); and forming ohmic-contact metal portions on the surface (52a) and in direct contact with the first and second implanted regions (59'), wherein the solid body (52, 53) comprises an epitaxial layer (52) including said surface portion (64) and a bulk portion, the surface portion extending over the bulk portion, wherein it further comprises alternatively: the step of forming a doped sub-region (64a-64c) having the first conductivity type (N) and a conductivity level higher than that of the bulk portion; or the steps of forming in the surface portion (64), by respective implantations of doping agents having the first conductivity type (N), a plurality of doped sub-regions (64a-64c) which extend in succession one after another in said direction (Z), each having a respective conductivity level higher than that of the bulk portion.

The doped sub-regions (64a-64c) may be implanted in the form of layers, thus forming a stack of doped layers that follow one another in said direction (Z).

Forming said plurality of doped sub-regions (64a-64c) may include: forming a first sub-region (64a) in the epitaxial layer (52) starting from the surface (52a); forming a second sub-region (64b) in the epitaxial layer (52) adjacent, along said direction (Z), to the first sub-region (64a); and forming a third sub-region (64c), which extends in the epitaxial layer (52) adjacent, along said direction (Z), to the second sub-region (64b).

The implantations may be designed in such a way that the second sub-region (64b) has a conductivity higher than the first sub-region (64a) and the third sub-region (64c).

Forming the first sub-region (64a) may include carrying out a first implantation with an energy comprised between 10 keV and 20 keV; and forming the second and third sub-regions (64b, 64c) may include carrying out a second implantation with an energy comprised between 150 keV and 250 keV.

Forming the first sub-region (64a) may include carrying out a first implantation with an implantation dose comprised between $1.0\cdot10^{11}$ and $1.0\cdot10^{13}$ at/cm$^2$; and forming the second and third sub-regions (64b, 64c) may include carrying out a second implantation with an implantation dose comprised between $1.0\cdot10^{13}$ and $1.0\cdot10^{15}$ at/cm$^2$.

The first, second, and third sub-regions (64a-64c) may be formed in such a way that the sum of the thicknesses of the first, second, and third sub-regions (64a-64c) is equal to or less than the thickness, in said direction (Z), of each one of the first and second implanted regions (59').

The material of the solid body may be one of the following: 4H—SiC, 6H—SiC, 3C—SiC, 15R—SiC.

The method may further include the step of forming a JBS (Junction Barrier Schottky) diode; said epitaxial layer (52) being a drift layer of said JBS diode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
   a solid body of silicon carbide having a surface and having a first conductivity type;
   a first implanted region and a second implanted region, the first and second implanted regions having a second conductivity type and extending into the solid body in a direction starting from the surface and delimiting between them a surface portion of the solid body;
   Schottky-contact metal portions on the surface and in direct contact with the surface portion; and
   ohmic-contact metal portions on the surface and in direct contact with the first and second implanted regions,
   wherein the solid body includes an epitaxial layer including the surface portion and a bulk portion, the surface portion extending over the bulk portion, and
   wherein the surface portion includes a plurality of doped sub-regions, which extend in succession one after another in the direction, each having the first conductivity type and a respective conductivity level higher than that of the bulk portion, the conductivity level of at least one of the doped sub-regions being different from the conductivity level of at least one other of the doped sub-regions.

2. The electronic device according to claim 1, wherein the doped sub-regions are layered, thus forming a stack of doped layers that follow one another in the direction.

3. The electronic device according to claim 1, wherein the plurality of doped sub-regions includes: a first sub-region, which extends into the epitaxial layer starting from the surface; a second sub-region, which extends in the epitaxial layer adjacent, along the direction, to the first sub-region; and a third sub-region, which extends in the epitaxial layer adjacent, along the direction, to the second sub-region.

4. The electronic device according to claim 3, wherein the second sub-region has a conductivity higher than the first sub-region and the third sub-region.

5. The electronic device according to claim 4, wherein: the first sub-region has a doping level between $1\cdot10^{16}$ at/cm$^3$ and $1\cdot10^{17}$ at/cm$^3$, the second sub-region has a doping level between $1\cdot10^{17}$ at/cm$^3$ and $1\cdot10^{20}$ at/cm$^3$, and the third sub-region has a conductivity level between $1\cdot10^{16}$ at/cm$^3$ and $1\cdot10^{17}$ at/cm$^3$.

6. The electronic device according to claim 3, wherein a sum of thicknesses of the first, second, and third sub-regions is equal to or less than a thickness, in the direction, of each one of the first and second implanted regions.

7. The electronic device according to claim 1, wherein the material of the solid body is one of: 4H—SiC, 6H—SiC, 3C—SiC, or 15R—SiC.

8. The electronic device according to claim 1, wherein the device forms a Junction Barrier Schottky (JBS) diode, the epitaxial layer being a drift layer of the JBS diode.

9. A method for manufacturing an electronic device, comprising:
providing a solid body of silicon carbide having a surface and having a first conductivity type;
forming in the solid body, by implantation of doping agents having a second conductivity type, a first implanted region and a second implanted region, which each extend in a direction starting from the surface and delimit between them a surface portion of the solid body, the solid body including an epitaxial layer including the surface portion and a bulk portion, the surface portion extending over the bulk portion;
forming Schottky-contact metal portions on the surface and in direct contact with the surface portion; and
forming ohmic-contact metal portions on the surface and in direct contact with the first and second implanted regions; and
forming in the surface portion, by respective implantations of doping agents having the first conductivity type, a plurality of doped sub-regions which extend in succession one after another in the direction, each having a respective conductivity level higher than that of the bulk portion, the conductivity level of at least one of the doped sub-regions being different from the conductivity level of at least one other of the doped sub-regions.

10. The method according to claim 9, wherein the doped sub-regions are implanted in the form of layers, thus forming a stack of doped layers that follow one another in the direction.

11. The method according to claim 9, wherein forming the plurality of doped sub-regions includes:
forming a first sub-region in the epitaxial layer starting from the surface;
forming a second sub-region in the epitaxial layer adjacent, along the direction, to the first sub-region; and
forming a third sub-region, which extends in the epitaxial layer adjacent, along the direction, to the second sub-region.

12. The method according to claim 11, wherein the second sub-region has a conductivity higher than the first sub-region and the third sub-region.

13. The method according to claim 12, wherein:
forming the first sub-region includes carrying out a first implantation with an energy between 10 keV and 20 keV; and
forming the second and third sub-regions includes carrying out a second implantation with an energy between 150 keV and 250 keV.

14. The method according to claim 12, wherein:
forming the first sub-region includes carrying out a first implantation with an implantation dose between $1.0 \cdot 10^{11}$ and $1.0 \cdot 10^{13}$ at/cm$^2$; and
forming the second and third sub-regions includes carrying out a second implantation with an implantation dose between $1.0 \cdot 10^{13}$ and $1.0 \cdot 10^{15}$ at/cm$^2$.

15. The method according to claim 11, wherein the first, second, and third sub-regions are formed in such a way that a sum of thicknesses of the first, second, and third sub-regions is equal to or less than a thickness, in the direction, of each one of the first and second implanted regions.

16. The method according to claim 9, wherein the material of the solid body is one of: 4H—SiC, 6H—SiC, 3C—SiC, or 15R—SiC.

17. The method according to claim 9, further comprising forming a JBS (Junction Barrier Schottky) diode, the epitaxial layer being a drift layer of the JBS diode.

18. A device, comprising:
a semiconductor body having a first conductivity type, the semiconductor body including a bulk portion and an epitaxial layer on the bulk portion, the epitaxial layer having a surface;
a first implanted region and a second implanted region, the first and second implanted regions having a second conductivity type and extending into the semiconductor body from the surface;
first and second ohmic contacts on the surface and extending at least partially into the first and second implanted regions, respectively;
a doped sub-region extending between the first and second implanted regions, the doped sub-region into the epitaxial layer from the surface and having the first conductivity type and a conductivity level higher than that of the bulk portion; and
a metal layer on the epitaxial layer and on the first and second ohmic contacts, the metal layer in direct contact with the doped sub-region.

19. The device of claim 18, wherein the doped sub-region includes a plurality of doped layers, each of the doped layers having the first conductivity type and a conductivity level higher than that of the bulk portion, the conductivity level of at least one of the doped layers being different from the conductivity level of at least one other of the doped layers.

20. The device of claim 19, wherein the doped sub-region includes a first doped layer having a first conductivity, a second doped layer having a second conductivity, and a third doped layer having a third conductivity, wherein the second conductivity is greater than the first and third conductivities.

* * * * *